United States Patent
Saito et al.

(10) Patent No.: US 8,269,492 B2
(45) Date of Patent: Sep. 18, 2012

(54) MAGNETIC BALANCE TYPE CURRENT SENSOR

(75) Inventors: Masamichi Saito, Niigata-Ken (JP);
Akira Takahashi, Niigata-Ken (JP);
Masahiro Iizuka, Niigata-Ken (JP);
Tatsuya Kogure, Niigata-Ken (JP);
Yosuke Ide, Niigata-Ken (JP); Yoshihiro Nishiyama, Niigata-Ken (JP); Kenji Ichinohe, Niigata-Ken (JP); Naoki Sakatsume, Niigata-Ken (JP); Tsuyoshi Nojima, Niigata-Ken (JP); Shigenobu Miyajima, Niigata-Ken (JP); Hidekazu Kobayashi, Niigata-Ken (JP)

(73) Assignee: Alps Green Devices Co., Ltd., Tokyo (JP)

( * ) Notice: Subject to any disclaimer, the term of this patent is extended or adjusted under 35 U.S.C. 154(b) by 243 days.

(21) Appl. No.: 12/891,550

(22) Filed: Sep. 27, 2010

(65) Prior Publication Data
US 2011/0080165 A1    Apr. 7, 2011

(30) Foreign Application Priority Data
Oct. 5, 2009    (JP) .................................. 2009-231633

(51) Int. Cl.
*G01R 33/09*    (2006.01)

(52) U.S. Cl. ........................................ 324/252; 324/249
(58) Field of Classification Search ................. 324/249, 324/252
See application file for complete search history.

(56) References Cited

U.S. PATENT DOCUMENTS
2006/0077598 A1    4/2006    Taylor et al.

FOREIGN PATENT DOCUMENTS
JP    2006-125962    5/2006
JP    2008-516255    5/2008

*Primary Examiner* — Bot Ledynh
(74) *Attorney, Agent, or Firm* — Beyer Law Group LLP

(57) ABSTRACT

A magnetic balance type current sensor measures a measured current which flows in a feedback coil when electrical conduction is provided by a voltage difference according to an induction magnetic field from the measured current and an equilibrium state is reached in which the induction magnetic field and a cancel magnetic field cancel each other. Sensor elements in a pair are arranged at positions with magnetic field from the measured current. The magnetization direction of the pinned magnetic layer in the magnetoresistive effect element of one sensor element is aligned in a forward direction with respect to the magnetic field formed by the measured current. The magnetization direction of the pinned magnetic layer in the magnetoresistive effect element of the other sensor element is aligned in a reverse direction with respect to the magnetic field formed by the measured current.

4 Claims, 7 Drawing Sheets

MAGNETIC BALANCE TYPE CURRENT SENSOR

CROSS REFERENCE TO RELATED APPLICATION

This application claims benefit of Japanese Patent Application No. 2009-231633 filed on Oct. 5, 2009, which is hereby incorporated by reference.

BACKGROUND

1. Technical Field

The present invention relates to a magnetic balance type current sensor using a magnetoresistive effect element (TMR element, GMR element).

2. Related Art

In an electric vehicle, a motor is driven with electricity generated by an engine, and the magnitude of a current for driving the motor is detected by, for example, a current sensor. As the current sensor, for example, a magnetic balance type current sensor is known which is described in Japanese Unexamined Patent Application Publication No. 2006-125962.

In this magnetic balance type current sensor, if a measured current flows into a primary conductor, an output voltage is generated in a magnetic detection element by a primary magnetic field according to the measured current, and a voltage signal output from the magnetic detection element is converted into a current which will flow in a secondary conductor. A magnetic field (cancel magnetic field) generated by the current flowing in the secondary conductor and the magnetic field generated by the measured current cancel each other, such that the magnetic field constantly becomes zero. At this time, the current flowing in the secondary conductor is converted to a voltage which will be extracted as an output. In Japanese Unexamined Patent Application Publication No. 2006-125962, a magnetoresistive effect element, such as a GMR (Giant Magneto Resistance) element, is used as the magnetic detection element, and a bridge circuit is constituted by a magnetoresistive effect element. The bridge circuit may be constituted by a magnetoresistive effect element and a pinned resistor, as in Japanese Unexamined Patent Application Publication No. 2008-516255.

SUMMARY

In recent years, with large output and high performance of an electric vehicle, a current value which has to be handled is increasing. If the current value to be handled increases, an error may occur in the measurement accuracy due to a difference in temperature characteristics (a difference in resistance temperature characteristics) between the magnetoresistive effect element and the pinned resistive element.

It is desirable to provide a magnetic balance type current sensor capable of measuring a current value with high accuracy even when a current value to be handled increases.

A magnetic balance type current sensor according to an embodiment of the invention includes a pair of sensor elements, each sensor element having a magnetoresistive effect element, the resistance value of which changes due to application of an induction magnetic field from a measured current and which has a pinned magnetic layer, a pinned resistive element, and a feedback coil arranged in the vicinity of the magnetoresistive effect element to generate a cancel magnetic field canceling the induction magnetic field, the pair of sensor elements constituting a bridge circuit for magnetic field detection including two outputs, which generate a voltage difference according to the induction magnetic field. The measured current is measured on the basis of a current which flows in the feedback coil when electrical conduction is provided to the feedback coil by the voltage difference and an equilibrium state is reached in which the induction magnetic field and the cancel magnetic field cancel each other. The sensor elements are arranged at positions with equal magnetic field from the measured current. The magnetization direction of the pinned magnetic layer in the magnetoresistive effect element of one sensor element is aligned in a forward direction with respect to the magnetic field formed by the measured current. The magnetization direction of the pinned magnetic layer in the magnetoresistive effect element of the other sensor element is aligned in a reverse direction with respect to the magnetic field formed by the measured current.

With this configuration, the sensor elements are arranged at the positions with equal magnetic field from the measured current (the center of an electric wire for the measured current). The magnetization direction of the pinned magnetic layer (pinned layer) in the magnetoresistive effect element of one sensor element is aligned in the forward direction with respect to (the same direction as) the magnetic field formed by the measured current. The magnetization direction of the pinned magnetic layer (pinned layer) in the magnetoresistive effect element of the other sensor element is aligned in the reverse direction with respect to the magnetic field formed by the measured current. Thus, the difference between the currents to be measured calculated by a pair of sensor elements is calculated, making it possible to cancel an error due to a temperature rise and to obtain a measured value with high accuracy.

The magnetic balance type current sensor according to the embodiment of the invention may further include arithmetic means for calculating a difference between a current flowing in the feedback coil of the one sensor element and a current flowing in the feedback coil of the other sensor element.

In the magnetic balance type current sensor according to the embodiment of the invention, a magnetic shield may be provided to attenuate the induction magnetic field and to enhance the cancel magnetic field, and the feedback coil, the magnetic shield, and the bridge circuit for magnetic field detection may be formed on the same substrate.

In the magnetic balance type current sensor according to the embodiment of the invention, the feedback coil may be arranged between the magnetic shield and the bridge circuit for magnetic field detection.

The magnetic balance type current sensor according to the embodiment of the invention includes a pair of sensor elements, each sensor element having a magnetoresistive effect element, the resistance value of which changes due to application of an induction magnetic field from a measured current and which has a pinned magnetic layer, a pinned resistive element, and a feedback coil arranged in the vicinity of the magnetoresistive effect element to generate a cancel magnetic field canceling the induction magnetic field, the pair of sensor elements constituting a bridge circuit for magnetic field detection including two outputs, which generate a voltage difference according to the induction magnetic field. The measured current is measured on the basis of a current which flows in the feedback coil when electrical conduction is provided to the feedback coil by the voltage difference and an equilibrium state is reached in which the induction magnetic field and the cancel magnetic field cancel each other. The sensor elements are arranged at positions with equal magnetic field from the measured current. The magnetization direction of the pinned magnetic layer in the magnetoresistive effect element of one sensor element is aligned in a forward direction with respect to the magnetic field formed by the measured current. The magnetization direction of the pinned magnetic layer in the magnetoresistive effect element of the other sensor element is aligned in a reverse direction with respect to the magnetic field formed by the measured current. Therefore, a current value can be measured with high accuracy even when a current value to be handled increases.

DESCRIPTION OF EXEMPLARY EMBODIMENT

Hereinafter, an embodiment of the invention will be described in detail with reference to the accompanying drawings.

Figure 1A:
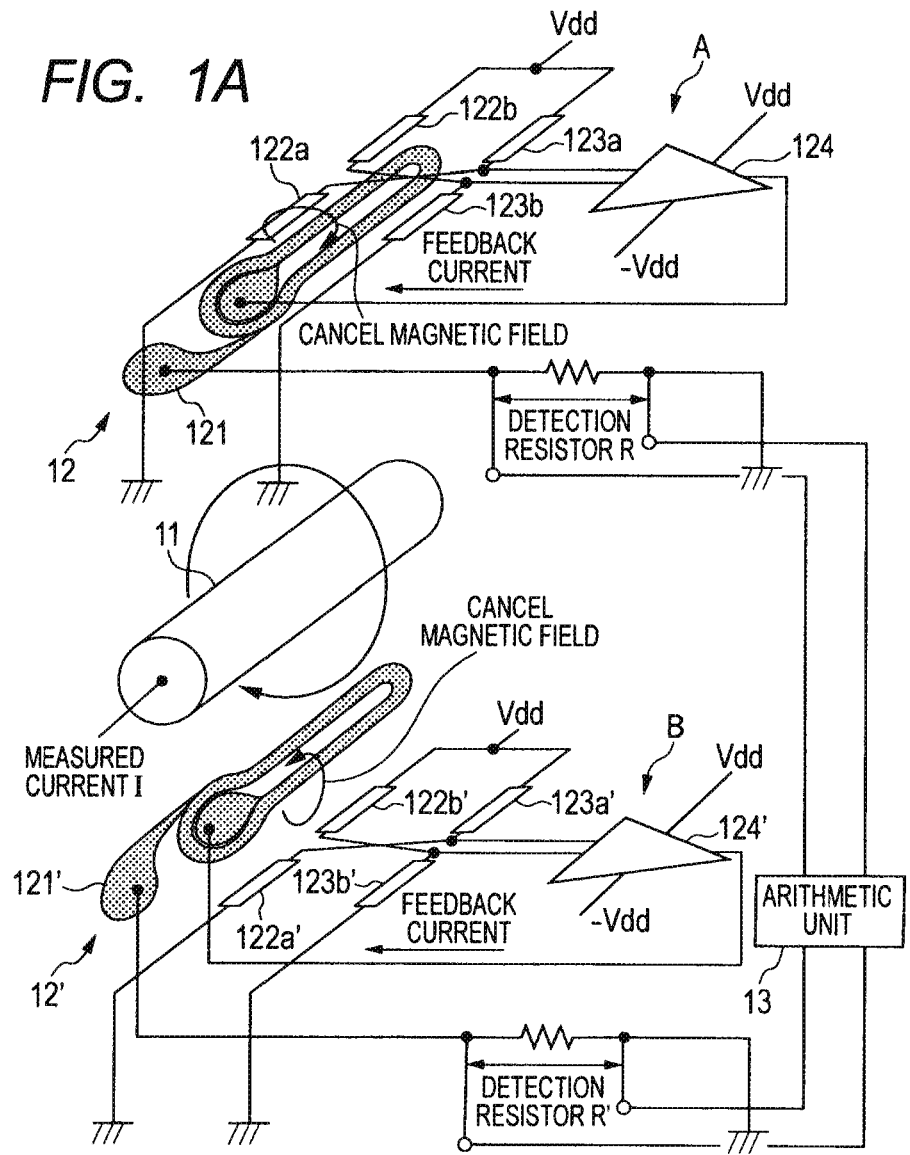
FIG. 1A is a diagram showing a magnetic balance type current sensor according to an embodiment of the invention.

FIG. 1A is a diagram showing a magnetic balance type current sensor according to the embodiment of the invention. The magnetic balance type current sensor shown in FIG. 1A is provided with a pair of sensor elements A and B arranged in the vicinity of a conductor 11 in which a measured current I flows. Each of the sensor elements A and B of the magnetic balance type current sensor includes a feedback circuit 12 which generates a magnetic field (cancel magnetic field) for canceling an induction magnetic field generated by the measured current I flowing in the conductor 11. An arithmetic unit 13 is also provided to calculate a difference between a current flowing in the feedback coil of one sensor element and a current flowing in the feedback coil of the other sensor element.

The feedback circuit 12 has a feedback coil 121 which is wound in a direction to cancel a magnetic field generated by the measured current I, two magnetoresistive effect elements 122a and 122b and two pinned resistive elements 123a and 123b which serve as a magnetic detection element, and an amplifier 124 which amplifies two outputs. The feedback circuit 12' has a feedback coil 121' which is wound in a direction to cancel a magnetic field generated by the measured current I, two magnetoresistive effect elements 122a' and 122b' and two pinned resistive elements 123a' and 123b' which serve as a magnetic detection element, and an amplifier 124' which amplifies two outputs.

The feedback coils 121 and 121' are constituted by planar coils. With this configuration, since no magnetic core is provided, the feedback coils can be manufactured at low cost. In addition, it is possible to prevent the spread of the cancel magnetic field generated from the feedback coil over a wide range and to prevent an influence on a peripheral circuit compared to a case where a toroidal coil is used. Furthermore, when the measured current is an alternating current, it is easy to control the cancel magnetic field generated by the feedback coil with a decrease in the amount of current for control by as much compared to a case where a toroidal coil is used. These effects increase when the measured current is an alternating current with a high frequency. When the feedback coil 121 is constituted by a planar coil, the planar coil is preferably provided such that both of the induction magnetic field and the cancel magnetic field are generated within the surface parallel to the surface on which the planar coil is to be formed.

The magnetoresistive effect elements 122 and 122' has resistance values which change by the application of the induction magnetic field from the measured current I. In the sensor element A, the two magnetoresistive effect elements 122a and 122b constitute a bridge circuit for magnetic field detection along with the two pinned resistive elements 123a and 123b. In the sensor element B, the two magnetoresistive effect elements 122a' and 122b' constitute a bridge circuit for magnetic field detection along with the two pinned resistive elements 123a' and 123b'. In this way, with the use of a bridge circuit for magnetic field detection having magnetoresistive effect elements, it is possible to realize a high-sensitivity magnetic balance type current sensor.

As the magnetoresistive effect elements 122 and 122', a TMR element (tunneling magnetoresistive effect element), a GMR element (giant magnetoresistive effect element), or the like may be used. For example, examples of the GMR element and the TMR element include a spin-valve GMR element which is constituted by a multilayer film having an antiferromagnetic layer, a pinned magnetic layer (pinned layer), a nonmagnetic layer, and a free magnetic layer, and a spin-value TMR element which is constituted by a multilayer film having an antiferromagnetic layer, a pinned magnetic layer (pinned layer), a nonmagnetic layer, and a free magnetic layer.

Figure 1B:
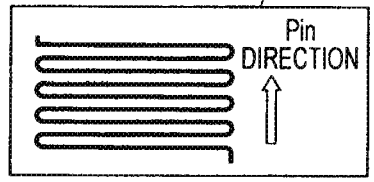
FIG. 1B is an enlarged view of a GMR element which is a magnetoresistive effect element.

As the spin-valve GMR element, a GMR element having a meander shape shown in FIG. 1B is preferably used. In this case, from a viewpoint of linearity, it is preferable that the longitudinal direction is perpendicular to the direction of the induction magnetic field and the direction of the cancel magnetic field (the longitudinal direction is orthogonal to the pinned (Pin) direction). With such a meander shape, the output of the magnetoresistive effect element can be adopted with a smaller number of terminals (two terminals) than a Hall element.

Figure 2:
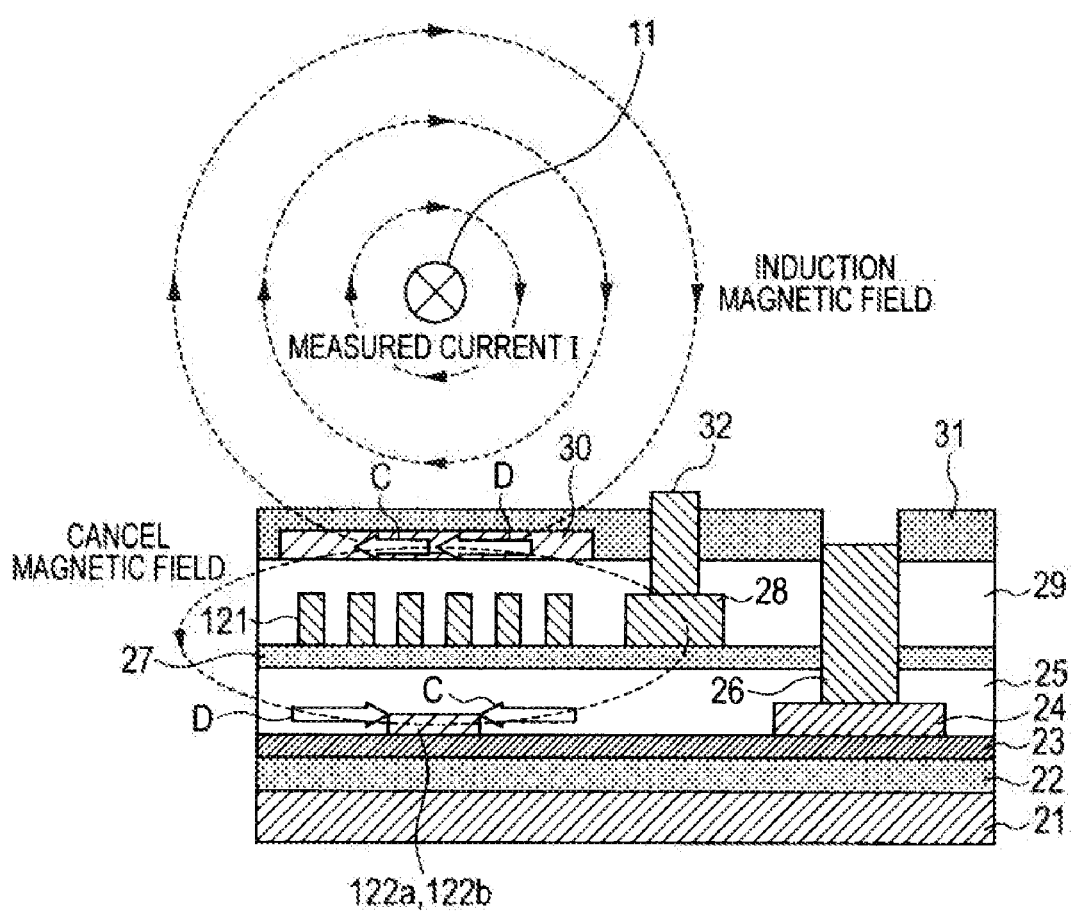
FIG. 2 is a sectional view showing the magnetic balance type current sensor shown in FIG. 1A.

FIG. 2 is a sectional view showing the magnetic balance type current sensor shown in FIG. 1. Although FIG. 2 shows only the sensor element A, the sensor element B has the same configuration as the sensor element A. As shown in FIG. 2, in the magnetic balance type current sensor of this embodiment, a feedback coil 121, a magnetic shield 30, and a bridge circuit for magnetic field detection are formed on the same substrate 21. With the configuration shown in FIG. 2, the feedback coil 121 is arranged between the magnetic shield 30 and the bridge circuit for magnetic field detection, and the magnetic shield 30 is arranged near the measured current I. That is, the magnetic shield 30, the feedback coil 121, and the magnetoresistive effect elements 122*a* and 122*b* are arranged in that order with respect to the conductor 11. Thus, it is possible to reduce the induction magnetic field which is applied to the magnetoresistive effect element from the measured current I. With the magnetic shield 30, the induction magnetic field which is applied to the magnetoresistive effect element from the measured current I is reduced, such that the cancel magnetic field from the feedback coil 121 can also be reduced.

The layer configuration shown in FIG. 2 will be described in detail. In the magnetic balance type current sensor shown in FIG. 2, a thermal silicon oxide film 22 serving as an insulator layer is formed on the substrate 21. An aluminum oxide film 23 is formed on the thermal silicon oxide film 22. The aluminum oxide film 23 may be deposited by, for example, sputtering or the like. As the substrate 21, a silicon substrate or the like is used.

The magnetoresistive effect elements 122*a* and 122*b* are formed on the aluminum oxide film 23. At this time, the pinned resistive elements 123*a* and 123*b* are provided along with the magnetoresistive effect elements 122*a* and 122*b*. Thus, the bridge circuit for magnetic field detection is produced.

An electrode 24 is formed on the aluminum oxide film 23. The electrode 24 may be formed by depositing an electrode material and then performing photolithography and etching.

A polyimide layer 25 serving as an insulator layer is formed on the aluminum oxide film 23 on which the magnetoresistive effect elements 122*a* and 122*b* and the electrode 24 are formed. The polyimide layer 25 may be formed by coating and hardening a polyimide material.

A silicon oxide film 27 is formed on the polyimide layer 25. The silicon oxide film 27 may be deposited by, for example, sputtering or the like.

The feedback coil 121 is formed on the silicon oxide film 27. The feedback coil 121 may be formed by depositing a coil material and then performing photolithography and etching. Alternatively, the feedback coil 121 may be formed by depositing a base material and then performing photolithography and plating.

A coil electrode 28 is formed on the silicon oxide film 27 in the vicinity of the feedback coil 121. The coil electrode 28 may be formed by depositing an electrode material and then performing photolithography and etching.

A polyimide layer 29 serving as an insulator layer is formed on the silicon oxide film 27 on which the feedback coil 121 and the coil electrode 28. The polyimide layer 29 may be formed by coating and hardening a polyimide material.

The magnetic shield 30 is formed on the polyimide layer 29. As the material for the magnetic shield 30, a high magnetic permeability material, such as an amorphous magnetic material, a permalloy-based magnetic material, or an iron-based microcrystalline material, may be used.

A silicon oxide film 31 is formed on the polyimide layer 29. The silicon oxide film 31 may be deposited by, for example, sputtering. Contact holes are formed in predetermined regions of the polyimide layer 29 and the silicon oxide film 31 (a region of the coil electrode 28 and a region of the electrode 24), and electrode pads 32 and 26 are respectively formed in the contact holes. In forming the contact holes, photolithography and etching are used. The electrode pads 32 and 26 may be formed by depositing electrode materials and then performing photolithography and plating.

As shown in FIG. 2, the magnetic balance type current sensor of this embodiment has the magnetic shield 30 near the feedback coil 121. The magnetic shield 30 can attenuate the induction magnetic field which is generated from the measured current I and applied to the magnetoresistive effect elements 122*a* and 122*b* (in the magnetoresistive effect element, the direction of the induction magnetic field C is opposite to the direction of the cancel magnetic field D) and can also enhance the cancel magnetic field D from the feedback coil 121 (in the magnetic shield, the direction of the induction magnetic field C is the same as the direction of the cancel magnetic field D). Thus, since the magnetic shield 30 functions as a magnetic yoke, a current flowing in the feedback coil 121 can be reduced, achieving power saving. With the magnetic shield 30, it is possible to reduce the influence of an external magnetic field. In the magnetic balance type current sensor having the above-described configuration, the feedback coil 121, the magnetic shield 30, and the bridge circuit for magnetic field detection are formed on the same substrate, achieving reduction in size. The magnetic balance type current sensor has no magnetic core, achieving reduction in size and low cost.

Although in FIG. 1A, a case has been described where a conductor having a circular section is used as the conductor 11, the invention may also be applied to a case where a conductor having a rectangular section is used. Although in FIG. 1A, a case has been described where two magnetoresistive effect elements and two pinned resistive elements constitute a bridge circuit for magnetic detection in the sensor element, the invention may also be applied to a case where a single magnetoresistive effect element and three pinned resistive elements constitute a bridge circuit for magnetic detection in the sensor element.

In the magnetic balance type current sensor of this embodiment, the magnetization direction of the pinned magnetic layer in the magnetoresistive effect element of one sensor element is aligned in a forward direction with respect to the magnetic field formed by the measured current, and the magnetization direction of the pinned magnetic layer in the magnetoresistive effect element of the other sensor element is aligned in a reverse direction with respect to the magnetic field formed by the measured current. That is, as shown in FIGS. 3A and 3B, the magnetization direction of the pinned magnetic layer (pinned layer) in each of the magnetoresistive effect elements 122*a* and 122*b* of the sensor element A is aligned in a reverse direction with respect to the magnetic field formed by the measured current I, and the magnetization direction of the pinned magnetic layer (pinned layer) in each of the magnetoresistive effect elements 122*a'* and 122*b'* of the sensor element B is aligned in the same direction as the magnetic field formed by the measured current I.

Figure 3A:
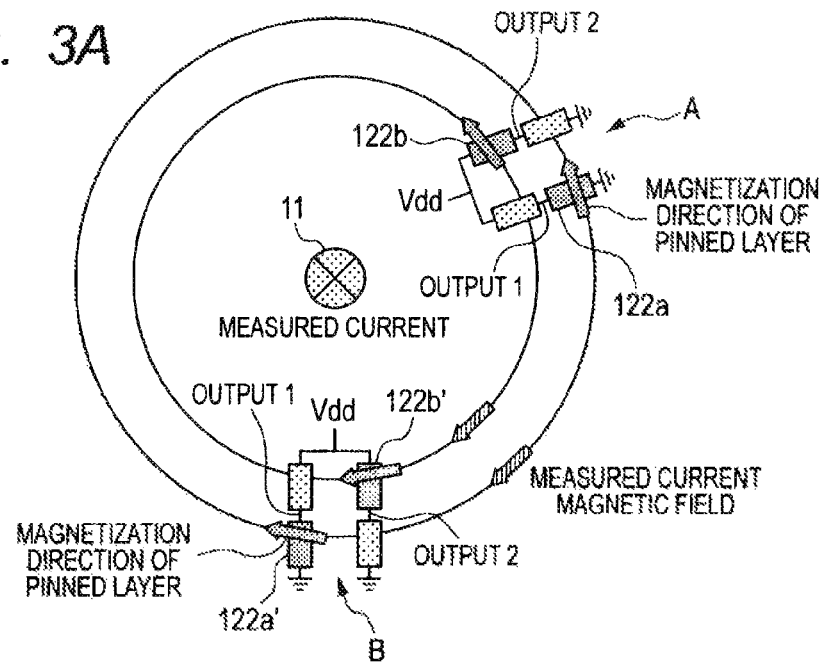
FIGS. 3A and 3B are diagrams showing the arrangement of sensor elements in the magnetic balance type current sensor according to the embodiment of the invention.
Figure 3B:
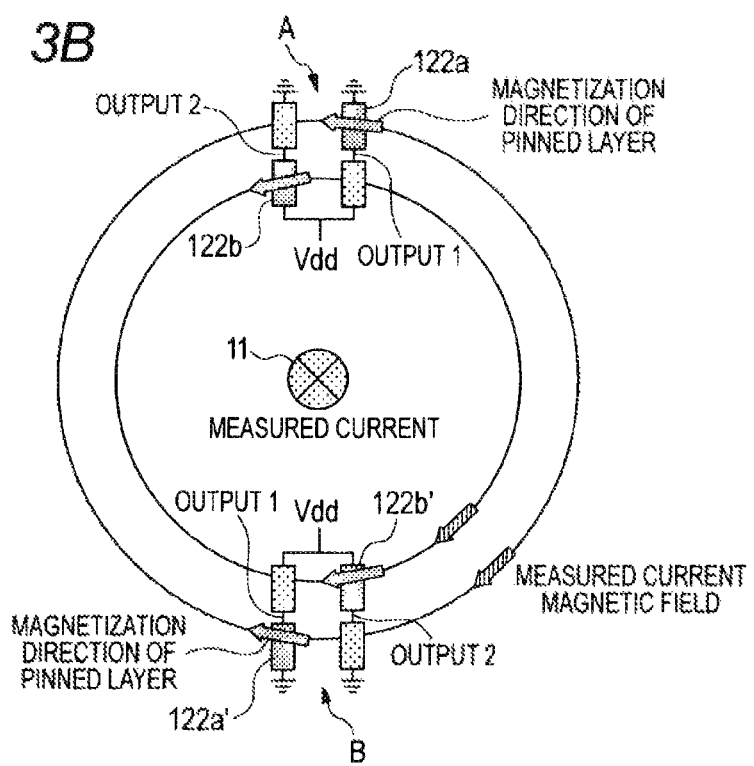

The positions where the sensor elements A and B are arranged are not particularly limited insofar as, as shown in FIGS. 3A and 3B, the positions are positions with equal magnetic field intensity from the measured current I (the center of an electric wire for the measured current). With such arrangement, it is possible to cancel errors (noise) due to temperature in the outputs of the sensor elements A and B.

The principle of the invention will now be described.

Figure 4:
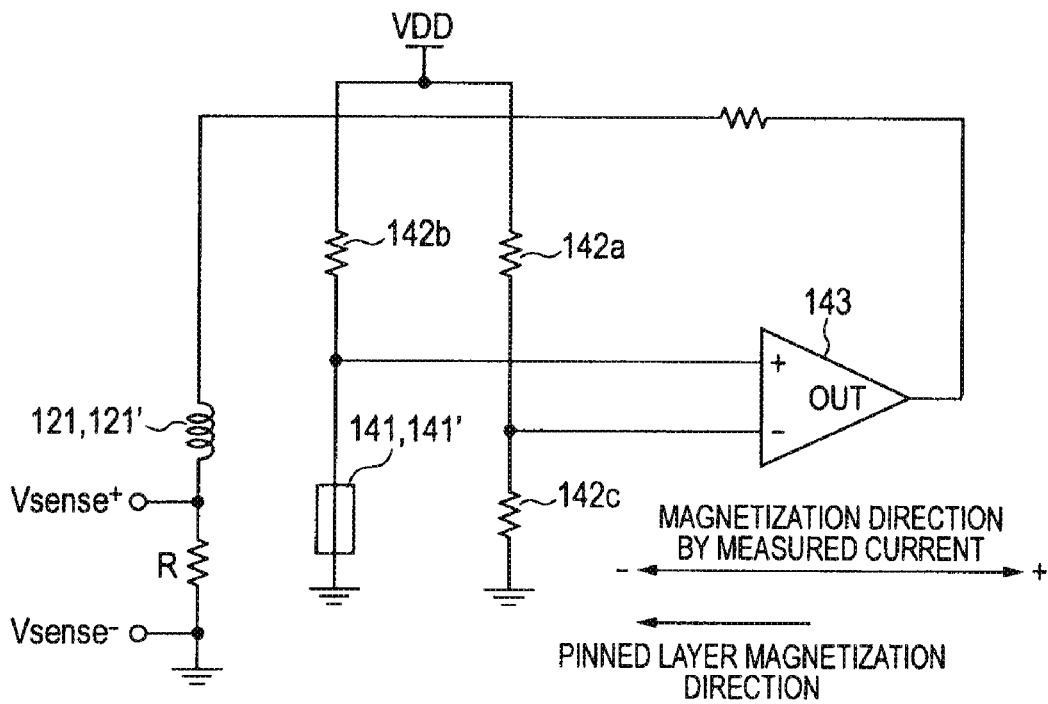
FIG. 4 is a circuit diagram showing the magnetic balance type current sensor according to the embodiment of the invention.
Figure 5:
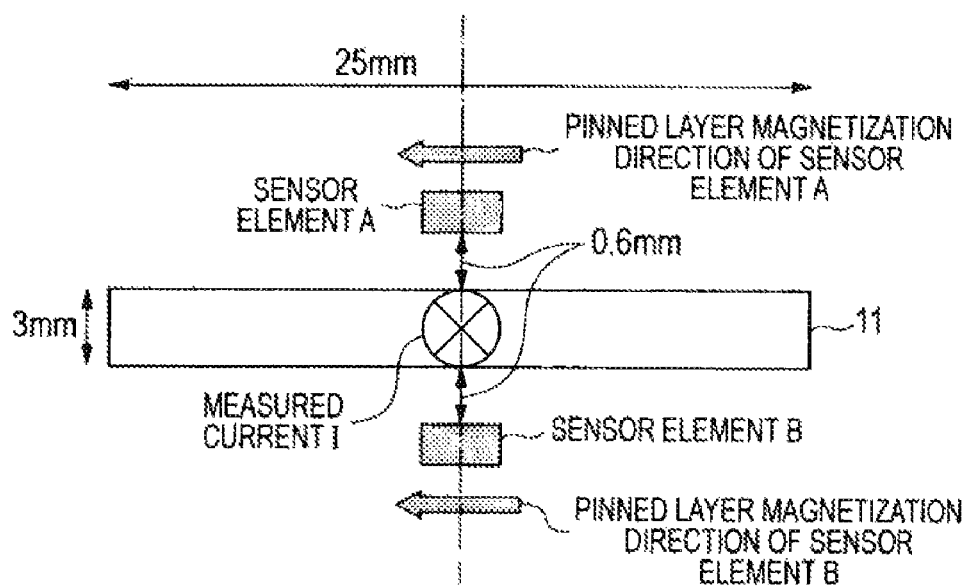
FIG. 5 is a diagram illustrating measurement conditions for measuring the magnetic balance type current sensor according to the embodiment of the invention.

As shown in FIG. 5, sensor elements A and B are arranged at symmetrical positions with respect to the conductor 11 (measured current I) in which the measured current I flows (the arrangement shown in FIG. 3B). Thus, the magnetic balance type current sensor of this embodiment is manufactured. At this time, the conductor 11 has a length of 25 mm and a thickness of 3 mm The sensor elements A and B are arranged at positions away from the center of the conductor 11 in the length direction by 0.6 mm. As shown in FIG. 4, each of the sensor elements A and B is constituted by a single GMR element 141 having about 8.5 kΩ and three pinned resistive elements 142a to 142c having about 8.5 kΩ. Each of the feedback coils 121 and 121' is wound 16 turns and has 65Ω.

Figure 6A:
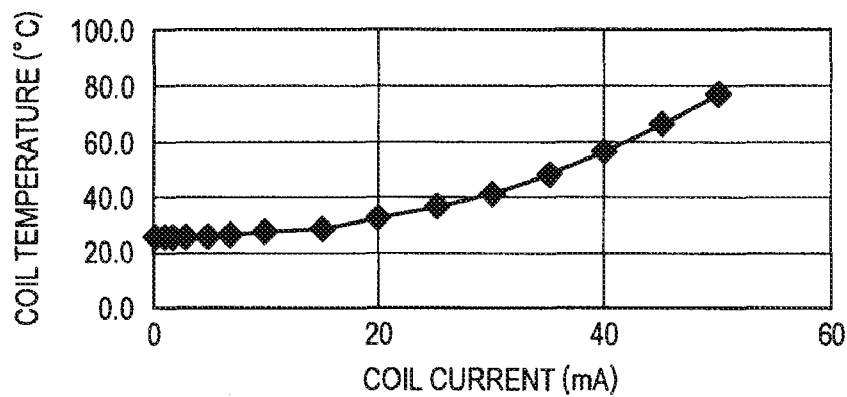
FIG. 6A is a diagram showing the relationship between a coil temperature and a coil current.
Figure 6B:
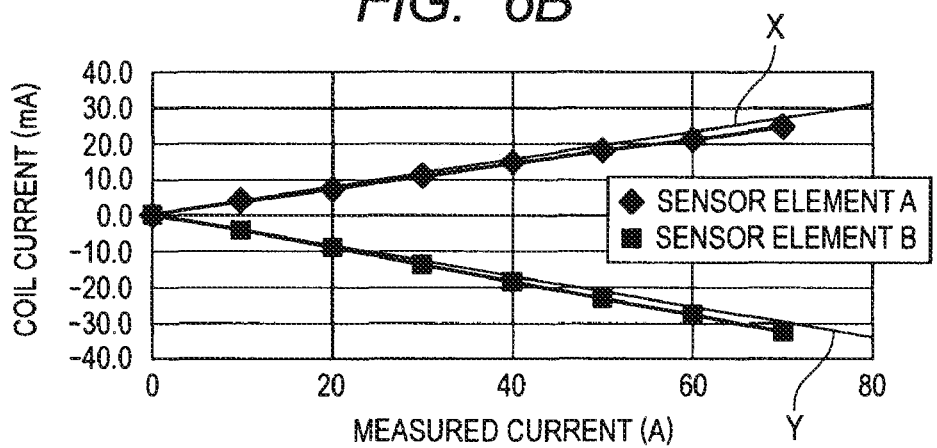
FIGS. 6B and 6C are diagrams showing the relationship between a coil current and a measured current.

With the configuration shown in FIG. 5, the measured current I flows in the conductor 11 and a detected current is calculated. The temperature of the feedback coil 121 rises as shown in FIG. 6A with an increase in a measurement current flowing in the feedback coil 121. With such a relationship, an error when the measured current I is 70 A is calculated as indicated by a line on the upper side of FIG. 6B. In the case of the sensor element A, while an original detected current when the measured current I is 70 A is 27.2 mA from a line (X) drawn in a region where a small amount of heat is generated, an actual measured value is 24.6 mA and an error is calculated to be 9.6%.

The reason for the occurrence of the error is as follows. That is, in the sensor element A, if the measured current increases, a measurement current (Icoil) increases and the feedback coil 121 generates heat due to Icoil. With the heat generation of the feedback coil 121, the GMR element 141 and the pinned resistors 142a to 142c undergo a temperature rise. The GMR element 141 and the pinned resistors 142a to 142c used herein have the relationship of the pinned resistor>the GMR element in terms of TCR (Temperature Coefficient Resistivity). Thus, if the temperature rises, the output of an output 1 of the sensor element A in FIG. 3B decreases. The output of an output 2 of the sensor element A in FIG. 3B is not changed even when temperature rises because only the pinned resistors are provided.

Meanwhile, if the measurement current (Icoil) increases, the magnetic field generated by the measured current I acts to increase the resistance of the GMR element 141 and to increase the output 1, but the amount of output for the temperature rise described above decreases. Then, while Icoil flows such that there is no difference between the output 1 and the output 2, the output difference decreases less than in a state where there is no temperature rise, and the value of Icoil decreases less than in a state where there is no temperature rise.

With the configuration shown in FIG. 5, the measured current I flows in the conductor 11, and a detected current is calculated. The temperature of the feedback coil 121' rises as shown in FIG. 6A with an increase in a measurement current flowing in the feedback coil 121'. With such a relationship, an error when the measured current I is 70 A is calculated as indicated by a line on the lower side of FIG. 6B. In the case of the sensor element A, while an original detected current when the measured current I is 70 A is 29.7 mA from a line (Y) drawn in a region where a small amount of heat is generated, an actual measured value is 33.0 mA and an error is calculated to be 11.1%.

The reason for the occurrence of the error is as follows. That is, in the sensor element B, if the measured current increases, the measurement current (Icoil) increases and the feedback coil 121' generates heat due to Icoil. With the heat generation of the feedback coil 121', the GMR element 141' and the pinned resistors 142a to 142c undergo a temperature rise. The GMR element 141' and the pinned resistors 142a to 142c used herein have the relationship of the pinned resistor>the GMR element in terms of TCR (Temperature Coefficient Resistivity). Thus, if the temperature rises, the output of the output 1 of the sensor element A in FIG. 3B decreases. The output of the output 2 of the sensor element A in FIG. 3B is not changed even when temperature rises because only the pinned resistors are provided.

Meanwhile, if the measurement current (Icoil) increases, the magnetic field generated by the measured current I acts to decrease the resistance of the GMR element 141' and to decrease the output 1, but the amount of output for the temperature rise described above further decreases. Then, while Icoil flows such that there is no difference between the output 1 and the output 2, the output difference increases more than in a state where there is no temperature rise, and the value of Icoil increases more than in a state where there is no temperature rise.

Figure 6C:
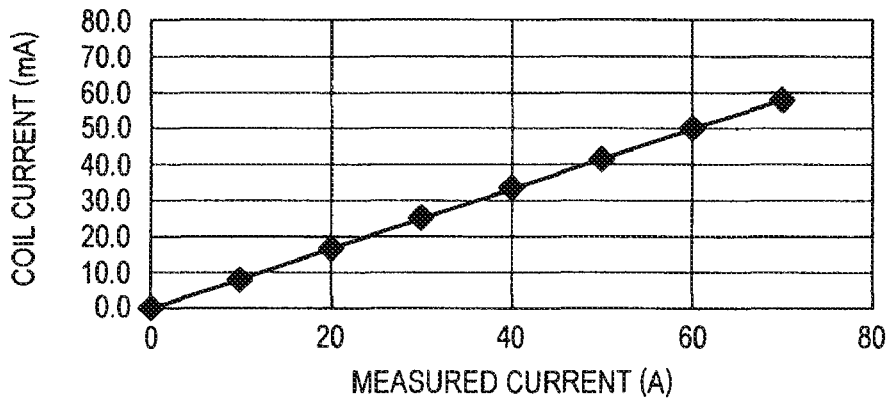

FIG. 6C shows an output when there is a difference between the sensor elements A and B. With this relationship, an error when the measured current I is 70 A is calculated. A detected current calculated from a regression line when the measured current I is 70 A is 57.4 mA, an actual measured value is 57.6 mA, and an error is 0.35%. In this way, the sensor elements A and B are arranged at positions with equal magnetic field intensity from the measured current I (the center of the electric wire for the measured current). The magnetization direction of the pinned magnetic layer (pinned layer) in each of the magnetoresistive effect elements 122a and 122b of the sensor element A is aligned in the forward direction with respect to (the same direction as) the magnetic field formed by the measured current I. The magnetization direction of the pinned magnetic layer (pinned layer) in each of the magnetoresistive effect elements 122a' and 122b' of the sensor element B is aligned in the reverse direction with respect to the magnetic field formed by the measured current I. Therefore, an output error depending on a temperature rise is equal to or smaller than 1%, and a current value can be measured with high accuracy even when a current value to be handled increases.

The bridge circuit for magnetic field detection includes two outputs which generate a voltage difference according to the induction magnetic field generated by the measured current I. In the bridge circuit for magnetic field detection of the sensor element A shown in FIG. 1A, a power source Vdd is connected to a connection point between the magnetoresistive effect element 122b and the pinned resistive element 123a, and the ground (GND) is connected to a connection point between the magnetoresistive effect element 122a and the pinned resistive element 123b. In the bridge circuit for magnetic field detection, one output is extracted from the connection point between the magnetoresistive effect element 122a and the pinned resistive element 123a, and another output is extracted from the connection point between the magnetoresistive effect element 122b and the pinned resistive element 123b. The two outputs are amplified by the amplifier 124 and then provided to the feedback coil 121 as a current (feedback current). The feedback current corresponds to the voltage difference according to the induction magnetic field. At this time, the cancel magnetic field is generated in the feedback coil 121 to cancel the induction magnetic field. A detection unit (detection resistor R) measures the measured current on the basis of a current flowing in the feedback coil 121 when an equilibrium state is reached in which the induction magnetic field and the cancel magnetic field cancel each other.

In the bridge circuit for magnetic field detection of the sensor element B shown in FIG. 1A, the power source Vdd is connected to a connection point between the magnetoresistive effect element 122b' and the pinned resistive element 123a', and the ground (GND) is connected to a connection point between the magnetoresistive effect element 122a' and the pinned resistive element 123b'. In the bridge circuit for magnetic field detection, one output is extracted from the connection point between the magnetoresistive effect element 122a' and the pinned resistive element 123a', and another output is extracted from the connection point between the magnetoresistive effect element 122b' and the pinned resistive element 123b'. The two outputs are amplified by the amplifier 124' and then provided to the feedback coil 121' as a current (feedback current). The feedback current corresponds to the voltage difference according to the induction magnetic field. At this time, the cancel magnetic field is generated in the feedback coil 121' to cancel the induction magnetic field. A detection unit (detection resistor R') measures the measured current on the basis of a current flowing in the feedback coil 121' when the equilibrium state is reached in which the induction magnetic field and the cancel magnetic field cancel each other.

The arithmetic unit 13 calculates a difference between the measured current acquired by the detection resistor R and the measured current acquired by the detection resistor R', and sets the difference as the measured current. Therefore, it is possible to cancel an error due to a temperature rise and to obtain a measured value with high accuracy.

In the magnetic balance type current sensor configured as above, as shown in FIG. 1A, the induction magnetic field generated from the measured current I is received by the magnetoresistive effect elements 122a and 122b, and the induction magnetic field is fed back such that the cancel magnetic field is generated from the feedback coil 121. The two magnetic fields (induction magnetic field and cancel magnetic field) cancel each other, thus appropriate adjustment is made such that the magnetic fields applied to the magnetoresistive effect elements 122a and 122b become zero.

Next, an example will be described for clarification of the effects of the invention.

The sensor elements A and B are arranged at symmetrical positions with respect to the conductor 11 (the measured current I) in which the measured current I flows (the arrangement shown in FIG. 3B), thus the magnetic balance type current sensor of this embodiment is manufactured. With such configuration, the feedback coil current (the measurement current (Icoil) is examined when the measured current changes in a range of −70 A to 70 A. The result is shown in FIG. 8A.

Figure 7:
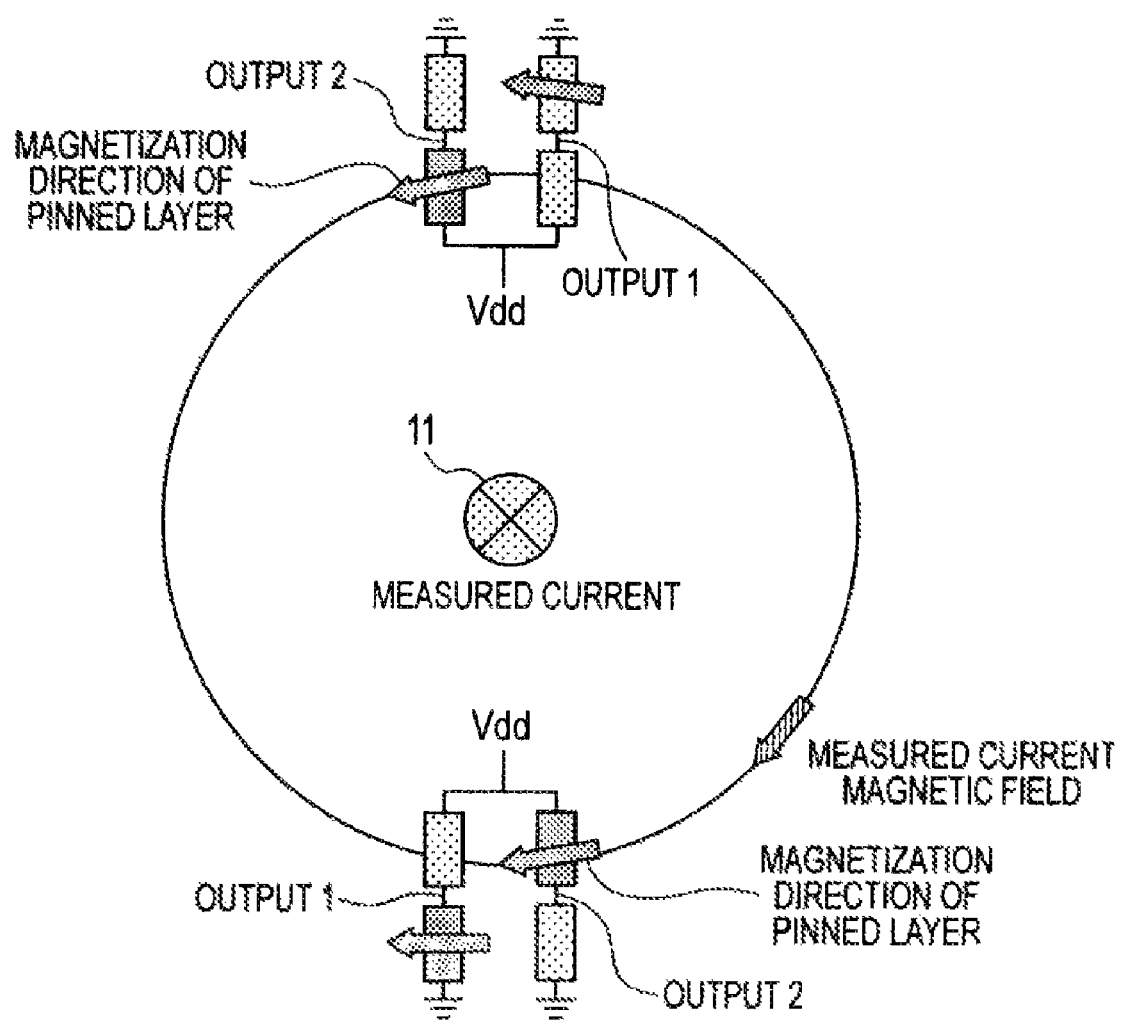
FIG. 7 is a diagram showing the configuration of a magnetic balance type current sensor as a reference example.

In comparison, as shown in FIG. 7, a single sensor element is arranged in the vicinity of the conductor 11 (the measured current I) in which the measured current I flows, thus a magnetic balance type current sensor is manufactured. With this configuration, the feedback coil current (the measurement current (Icoil)) is examined when the measured current changes in a range of −70 A to 70 A. The result is shown in FIG. 8B.

Figure 8A:
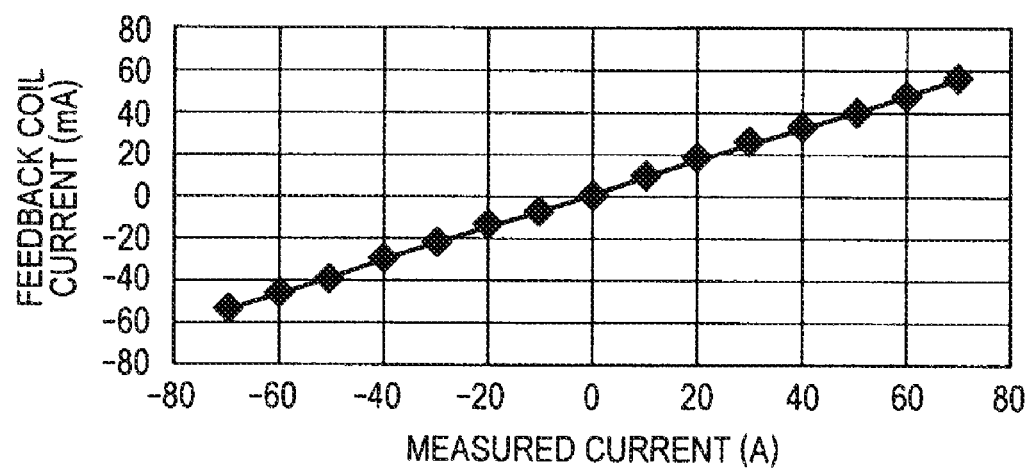
FIG. 8A is a diagram showing a measured output of the magnetic balance type current sensor according to the embodiment of the invention.
Figure 8B:
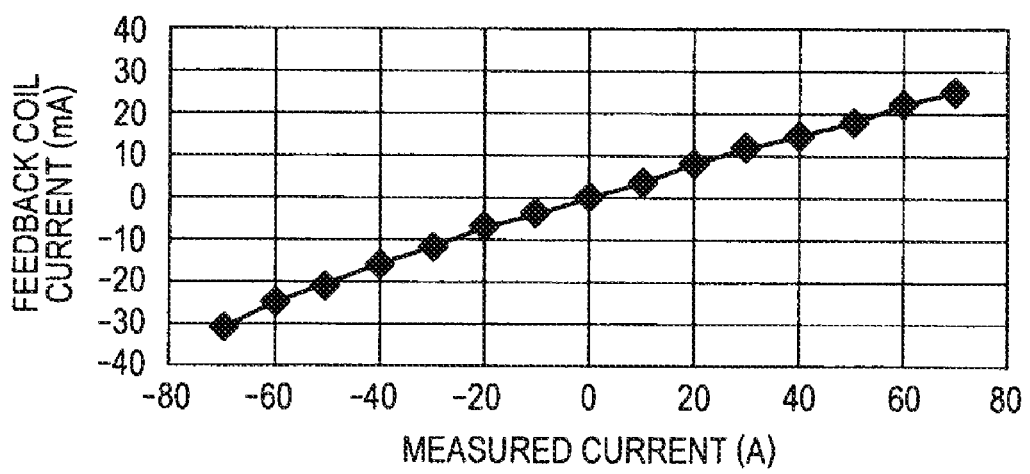
FIG. 8B is a diagram showing a measured output of the magnetic balance type current sensor according to the reference example.

As will be understood from FIG. 8A, in the magnetic balance type current sensor of this embodiment, the linearity between the feedback coil current and the measured current is high, and even when the measured current increases and there is a temperature rise, the measured current can be measured with high accuracy. It is thought that this is because the error due to the temperature rise is canceled by a pair of sensor elements. Meanwhile, in the magnetic balance type current sensor having a single sensor element, the linearity between the feedback coil current and the measured current is low. It is thought that this is because the single sensor element is provided, and the error due to the temperature rise may not be canceled.

The invention is not limited to the foregoing embodiment, and various modifications may be made. For example, although in the foregoing embodiment, a case has been described where a pair of sensor elements are used, the invention is not limited thereto. The invention may also be applied to a case where multiple sensor elements are used. In the foregoing embodiment, materials, arrangement position, thickness, and size of each layer, manufacturing methods, and the like may be appropriately modified. The invention may be appropriately modified without departing from the scope of the invention. Although in the foregoing embodiment, the measurement of the measured current of up to 70 A has been described, according to the invention, if the distance from the center of the conductor increases, it becomes possible to detect a larger measured current.

The invention may be applied to a current sensor which detects the magnitude of a current for driving the motor of the electric vehicle.

It should be understood by those skilled in the art that various modifications, combinations, sub-combinations and alterations may occur depending on design requirements and other factors insofar as they are within the scope of the appended claims or the equivalents thereof.

What is claimed is:

1. A magnetic balance type current sensor comprising:
a pair of sensor elements, each sensor element having a magnetoresistive effect element, the resistance value of which changes due to application of an induction magnetic field from a measured current and which has a pinned magnetic layer, a pinned resistive element, and a feedback coil arranged in the vicinity of the magnetoresistive effect element to generate a cancel magnetic field canceling the induction magnetic field, the pair of sensor elements constituting a bridge circuit for magnetic field detection including two outputs, which generate a voltage difference according to the induction magnetic field,
wherein the measured current is measured on the basis of a current which flows in the feedback coil when electrical conduction is provided to the feedback coil by the voltage difference and an equilibrium state is reached in which the induction magnetic field and the cancel magnetic field cancel each other,
the sensor elements are arranged at positions with equal magnetic field from the measured current,
the magnetization direction of the pinned magnetic layer in the magnetoresistive effect element of one sensor element is aligned in a forward direction with respect to the magnetic field formed by the measured current, and
the magnetization direction of the pinned magnetic layer in the magnetoresistive effect element of the other sensor element is aligned in a reverse direction with respect to the magnetic field formed by the measured current.

2. The magnetic balance type current sensor according to claim 1, further comprising:
arithmetic means for calculating a difference between a current flowing in the feedback coil of the one sensor element and a current flowing in the feedback coil of the other sensor element.

3. The magnetic balance type current sensor according to claim 1,
wherein a magnetic shield is provided to attenuate the induction magnetic field and to enhance the cancel magnetic field, and
the feedback coil, the magnetic shield, and the bridge circuit for magnetic field detection are formed on the same substrate.

4. The magnetic balance type current sensor according to claim 3,
wherein the feedback coil is arranged between the magnetic shield and the bridge circuit for magnetic field detection.

* * * * *